(12) United States Patent
Furukawa et al.

(10) Patent No.: US 6,380,027 B2
(45) Date of Patent: *Apr. 30, 2002

(54) DUAL TOX TRENCH DRAM STRUCTURES AND PROCESS USING V-GROOVE

(75) Inventors: Toshiharu Furukawa, Essex Junction, VT (US); Jeffrey P. Gambino, Gaylordsville, CT (US); Edward W. Kiewra, Verbank, NY (US); Jack A. Mandelman, Stormville, NY (US); Carl J. Radens, LaGrangeville, NY (US); William R. Tonti, Essex Junction, VT (US); Mary E. Weybright, Pleasant Valley, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,127

(22) Filed: Jan. 4, 1999

(51) Int. Cl.⁷ .............................................. H01L 21/242
(52) U.S. Cl. ...................... 438/241; 438/271; 438/296; 438/386
(58) Field of Search ................................ 438/150, 218, 438/221, 241, 258, 271, 259, 279, 294, 296, 386

(56) References Cited

U.S. PATENT DOCUMENTS

| | | | |
|---|---|---|---|
| 3,975,221 A | 8/1976 | Rodgers | 438/271 |
| 4,003,126 A | 1/1977 | Holmes et al. | 438/282 |
| 4,057,844 A | 11/1977 | Smedley | 361/111 |
| 4,065,783 A | 12/1977 | Ouyang | 257/334 |
| 4,084,175 A | 4/1978 | Ouyang | 257/336 |
| 4,116,720 A | 9/1978 | Vinson | 438/239 |
| 4,219,835 A | 8/1980 | van Loon et al. | 257/330 |
| 4,326,332 A | 4/1982 | Kenney | 438/239 |
| 4,502,208 A | 3/1985 | McPherson | 438/281 |
| 4,595,454 A | 6/1986 | Dautremont-Smith et al. | 438/43 |
| 4,763,180 A | 8/1988 | Hwang et al. | 257/302 |
| 4,859,621 A | 8/1989 | Einthoven | 438/271 |
| 4,864,374 A | * 9/1989 | Banerjee | 257/68 |
| 4,929,987 A | 5/1990 | Einthoven | 257/330 |
| 5,196,395 A | 3/1993 | James et al. | 505/329 |
| 5,204,281 A | * 4/1993 | Pfiester | 438/245 |
| 5,474,946 A | 12/1995 | Ajit et al. | 438/138 |
| 5,686,364 A | 11/1997 | Ohki et al. | 438/406 |
| 5,691,217 A | 11/1997 | Honeycutt | 438/197 |
| 5,811,336 A | * 9/1998 | Kasai | 438/271 |
| 5,945,707 A | * 8/1999 | Bronner et al. | 257/330 |
| 5,956,594 A | * 9/1999 | Yang et al. | 438/396 |
| 6,323,082 B1 | * 11/2001 | Furukawa et al. | 438/129 |

* cited by examiner

*Primary Examiner*—Carl Whitehead, Jr.
*Assistant Examiner*—Jamie L. Brophy
(74) *Attorney, Agent, or Firm*—McGinn & Gibb, PLLC; Mark F. Chadurjian, Esq.

(57) ABSTRACT

A structure and method for simultaneously forming array structures and support structures on a substrate comprises forming the array structures to have a V-groove, forming the support structures to have a planar surface, and simultaneously forming a first oxide in the V-groove and a second oxide in the planar surface, wherein the first oxide is thicker than the second oxide.

25 Claims, 13 Drawing Sheets

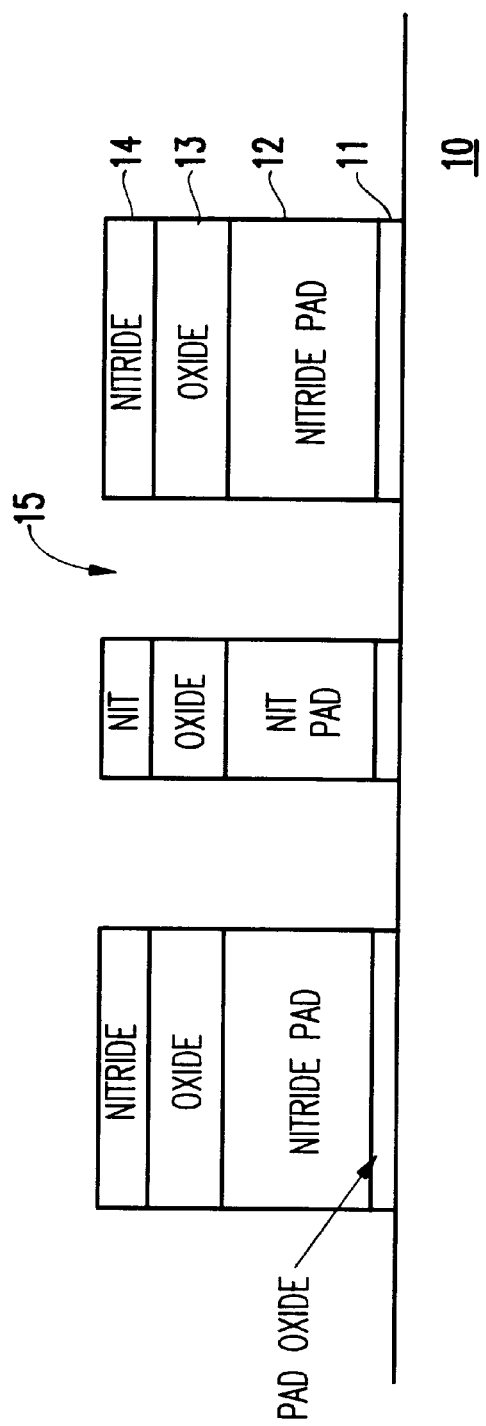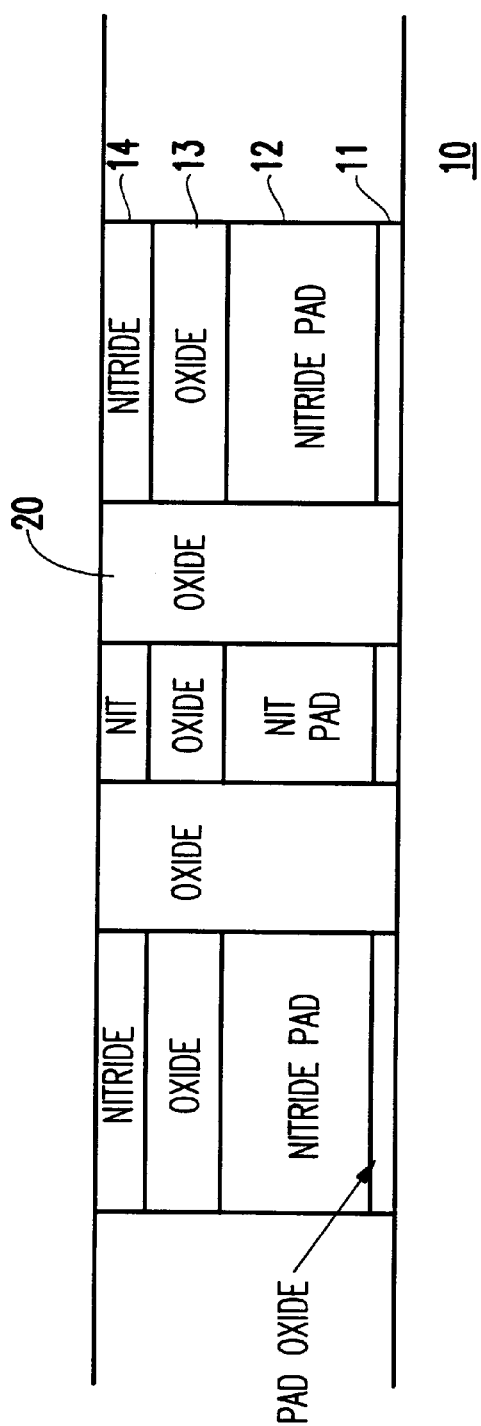

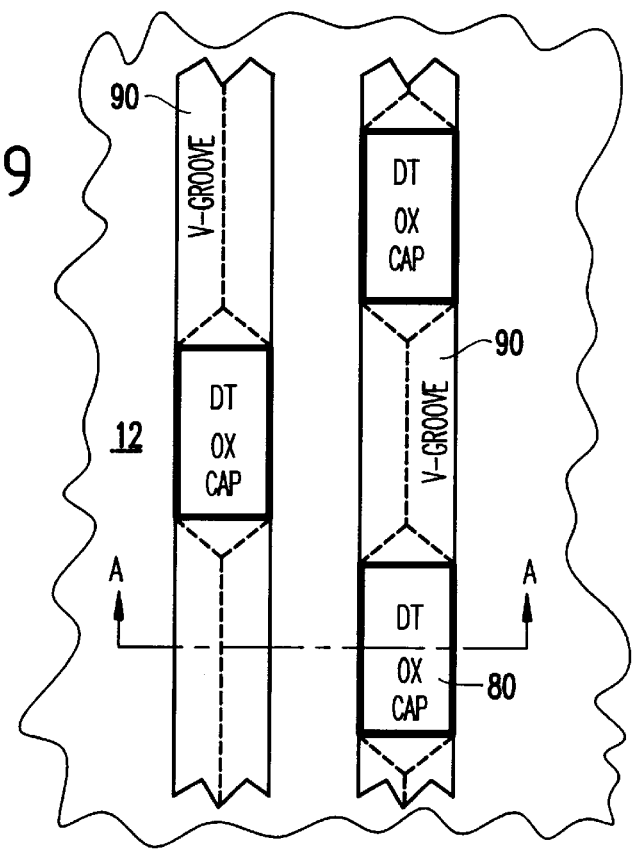
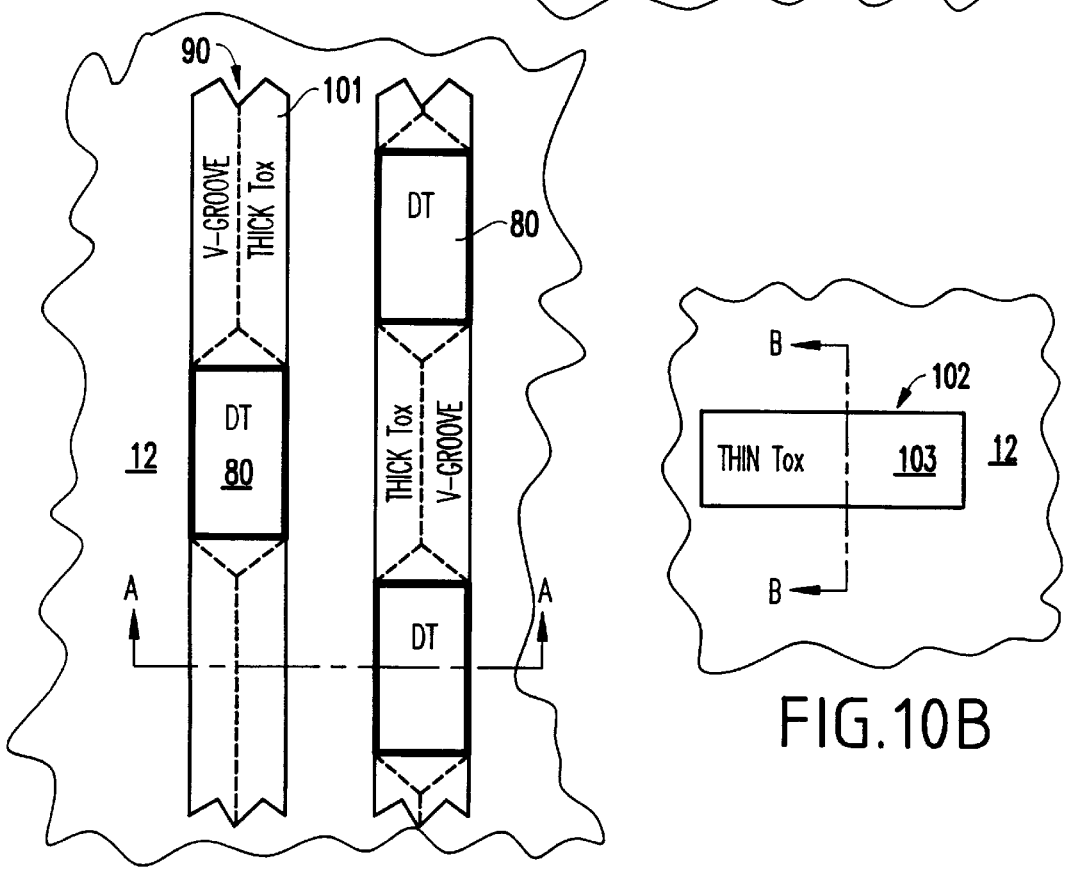

A-A

US 6,380,027 B2

DUAL TOX TRENCH DRAM STRUCTURES AND PROCESS USING V-GROOVE

BACKGROUND OF THE INVENTION

1. Field of the Invention

The present invention generally relates metal oxide semiconductors (MOS) and more specifically to a V-groove metal oxide semiconductor (VMOS) structure having a shallow trench isolation (STI) region.

2. Description of the Related Art

Metal oxide semiconductor field effect transistors (MOSFETs) are typically formed to have active arrays of devices such as in dynamic random access memories (DRAM), read only memories (ROMs), electrically programable read only memories (EPROMs) and other similar devices. In addition, such structures will include support MOSFETs such as drivers, decoders, I/O circuitry and other similar devices. The array MOSFETs require a relatively thick gate oxide when compared to the support MOSFETs.

A relatively thick gate oxide layer increases the maximum wordline boost voltage which can be applied to the array MOSFETs. To the contrary, the support MOSFETs exhibit significantly increased performance as the gate oxide thickness decreases.

Therefore, decreasing the gate oxide thickness increases the performance of the support MOSFETs but decreases charge transfer of efficiency (and degrades the performance) of the array MOSFETs. Therefore, the conventional structures suffer from an inherent trade-off between the gate oxide thickness required for the array MOSFETs and the gate oxide thickness required for the support MOSFETs.

Conventional solutions to the foregoing trade-off problem include a dual gate oxide process where the gate oxide for the array MOSFETs is formed separately from the gate oxide for the support MOSFETs. However, such processing substantially increases the cost of producing the device and further increases the chance for defects. Therefore, there is a need for a single process which selectively forms the gate oxide differently for different devices.

SUMMARY OF THE INVENTION

It is, therefore, an object of the present invention to provide a structure and method for simultaneously forming array structures and support structures on a substrate, the method comprising forming the array structures to have a V-groove, forming the support structures to have a planar surface, and simultaneously forming a first oxide in the V-groove and a second oxide in the planar surface, wherein the first oxide is thicker than the second oxide.

The V-groove has at least one surface along a <111> crystal plane of the substrate and the planar surface has a surface along a <100> crystal plane of the substrate. The forming of the V-groove comprises performing a crystallographic preferential etch which etches a <111> crystal plane of the substrate at a different rate than a <100> crystal plane of the substrate.

The method may further comprise forming a shallow trench isolation region for the active structures, forming a protective layer above the substrate, patterning the protective layer to define the active structures and storage structures, forming conductors in the active structures and the storage structures, and forming wordlines above the conductors, wherein the patterned protective layer aligns the conductors and the wordlines. The forming of the wordlines comprises positioning a mask approximately over the active structures and the storage structures, forming grooves for the wordlines using the mask, and depositing a conductive wordline material in the grooves, wherein the protective layer aligns at least one side of the wordlines and the conductors.

The method may further comprise forming a protective layer above the substrate, forming stripes in the protective layer, and patterning the protective layer to alternately define the active structures and storage structures along the stripes, wherein the stripes align the active structures and the storage structures. The method may further comprise forming a protective layer above the substrate, patterning the protective layer to define the active structures and storage structures, forming trenches for the storage structures in the substrate using the patterned protective layer as a mask, forming storage conductors in the trenches, forming a protective oxide layer over the storage conductor, and forming the V-groove of the active structures using the patterned protective layer.

Additionally, the invention includes a semiconductor device comprising a substrate having V-grooves and planar surfaces, array structures in the V-grooves, support structures in the planar surfaces, a first oxide in the V-grooves and a second oxide in the planar surfaces, wherein the first oxide is thicker than the second oxide.

The V-grooves have at least one surface along a <111> crystal plane of the substrate and the planar surface has a surface along a <100> crystal plane of the substrate. The invention may further comprise a shallow trench isolation region for the active structures.

Also, the invention may include a protective layer above the substrate having a protective layer defining the active structures and storage structures, conductors in the active structures and the storage structures; and wordlines above the conductors, wherein the patterned protective layer aligns the conductors and the wordlines. The protective layer aligns at least one side of the wordlines and the conductors.

The invention may further comprise a protective layer above the substrate having stripes, the active structures and storage structures alternating along the stripes, wherein the stripes align the active structures and the storage structures.

The invention takes advantage of a selective oxide growth ability and grows thicker gate oxides of the array MOSFETs on surfaces in V-grooves <111>, while thinner support MOSFET oxides are simultaneously grown on the top <100> surface. More specifically, with the invention, the gate oxide of the array MOSFETs are grown on <111> surfaces in V-grooves, while the support MOSFET oxides are grown conventionally on the top <100> surface. Therefore, the invention can selectively form relatively thin oxide layers for the support MOSFETs and simultaneously form thicker gate oxide layers for the array MOSFETs, thereby increasing device performance and decreasing defects.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross-sectional view of a semiconductor device according to the invention;

FIG. 2 is a cross-sectional view of a semiconductor device according to the invention;

FIG. 9 is a top view of a semiconductor device according to the invention;

FIGS. 10A–10B are top views of a semiconductor device according to the invention;

DETAILED DESCRIPTION OF REFERRED EMBODIMENTS OF THE INVENTION

Figure 19:
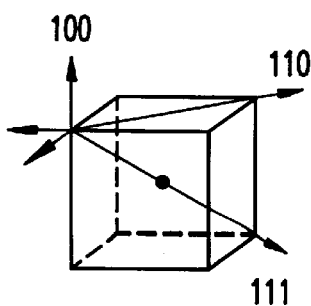
FIG. 19 is a perspective view of planes of a crystal.

Oxides grown on silicon are approximately 50%–70% thicker on surfaces aligned with the <111> crystal plane relative to the <100> crystal plane depending on oxidation conditions. FIG. 19 illustrates a representative crystal and the <100>, <110> and <111> planes.

The invention takes advantage of this selective growth ability and grows the thicker gate oxide of the array MOSFETs on surfaces in V-grooves <111>, while the thinner support MOSFET oxides are simultaneously grown on the top <100> surface. More specifically, with the invention, the gate oxide of the array MOSFETs are grown on <111> surfaces in V-grooves, while the support MOSFET oxides are grown conventionally on the top <100> surface.

Therefore, the invention can selectively form relatively thin oxide layers for the support MOSFETs and simultaneously form thicker gate oxide layers for the array MOSFETs. For example, an oxide having a 6 nm thickness (Tox) can be formed for the array MOSFETs, which is suitable for gate boost voltages up to 3.3 V, and an oxide having a 3.5 nm thickness, for the support devices, can be formed to provide enhanced performance.

Various crystallographic preferential etches for silicon are capable of reliably forming square based pyramidal pits having <111> surfaces in a <100> surface of a wafer. For example, a KOH (potassium hydroxide) etch has a <100> to <111> etch rate ratio of 400:1 and is maskable with $Si_3N_4$ or $SiO_2$. EDA (Ethylene Diamine Pyrocatechol) has a <100> to <111> etch rate ratio of 35:1 and is more easily masked with $Si_3N_4$ or $SiO_2$ than KOH.

Referring now to the drawings, and more particularly to FIG. 1, the invention includes a silicon wafer 10 having a customary pad structure. The pad structure includes, for example, a thin thermal pad oxide layer 11 (comprising, for example, silicon dioxide, silicon oxynitride or other similar dielectric materials) and a thick silicon nitride pad layer 12. Such structures are formed using conventional processes well known to those ordinarily skilled in the art such as sequential chemical vapor deposition (CVD), sputtering, and other methods. An oxide layer 13 (such as silicon dioxide, silicon oxynitride or other similar dielectric materials) and a nitride layer 14 are formed over the nitride pad 12 again, using similar well-known conventional processes. Stripes (e.g., openings) 15 are formed through the nitride 14, oxide 13, pad nitride 12 and pad oxide 11 layers down to the silicon substrate 10 using conventional removal processes such as lithography, and reactive ion etching (RIE).

Figure 3:
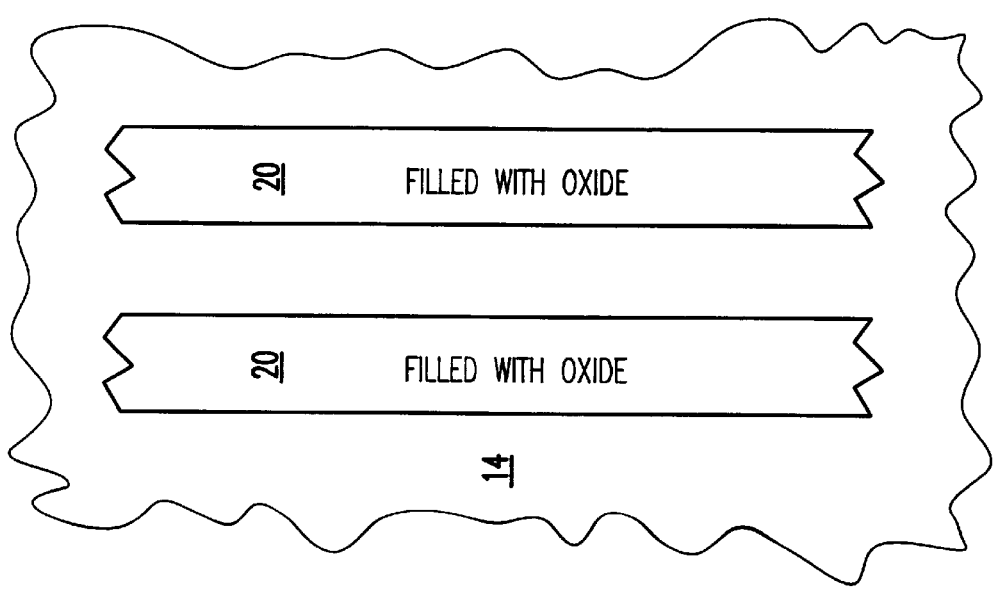
FIG. 3 is a top view of a semiconductor device according to the invention.

As shown in FIG. 2, an oxide 20 (such as the oxides mentioned above) is deposited in the stripes 15 between the pad layers, again, using well-known techniques such as chemical vapor deposition and planarization processes. FIG. 3 is a plan (e.g., top) view of the oxide 20 stripes between the top nitride layer 14.

Figure 4:
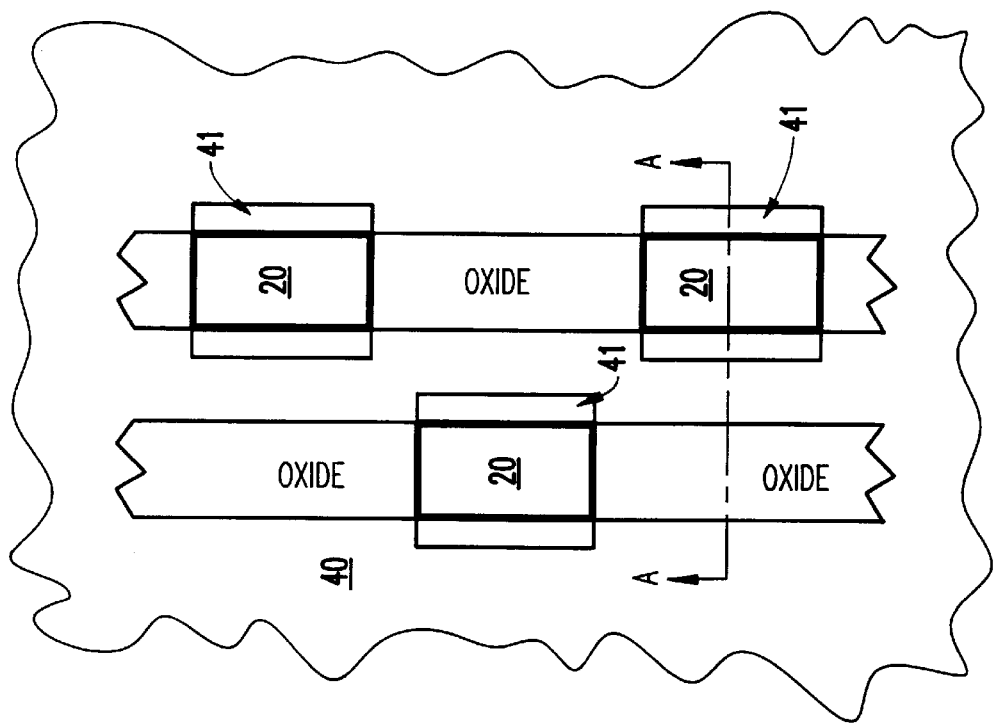
FIG. 4 is a top view of a semiconductor device according to the invention.
Figure 5:
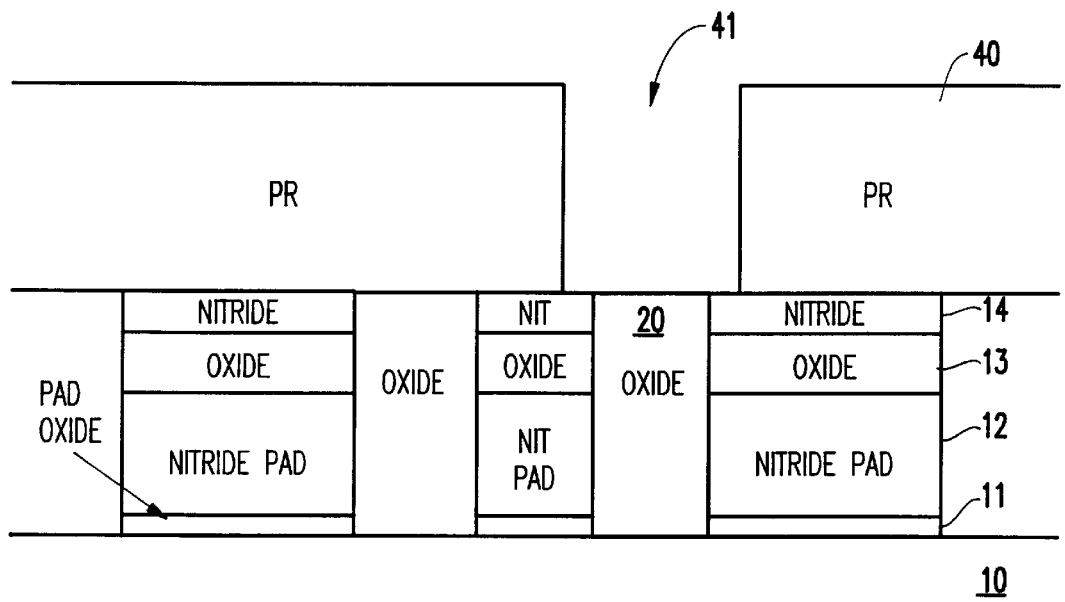
FIG. 5 is a cross-sectional view of a semiconductor device according to the invention.

FIG. 4 illustrates a photoresist 40 is deposited on the pad layers 20. The photoresist 40 is formed to have openings 41 where the oxide 20 is exposed (the longer sections of the oxide layers 20 are illustrated for reference only and would not otherwise appear through the photoresist 40 from the top view shown in FIG. 4). FIG. 5 is a cross-sectional view of the structure shown in FIG. 4 along line A—A and illustrates the opening 41 in the photoresist 40 above the oxide stripe 20. The opening is wider than the stripe to assure that, even with misalignment, the entire width of the oxide stripe is exposed without the opening overlapping onto an adjacent stripe.

Conventional reactive ion etching is used to form a deep trench 62 in the silicon substrate 10. In the course of etching the deep trench the photoresist (40) and nitride layer (14) are removed. The trench 62 is lined with a storage node dielectric layer 61. Then, the trench is partially filled with a first layer of conductive material 60 which is preferably polysilicon, but could also comprise other conductive materials. Similarly, the formation of the first layer of conductive material 60 includes a low-pressure chemical vapor deposition (LPCVD) of polysilicon, anisotropic etching of the conductive fill 60, planarization and recessing. The exposed portion of the dielectric 61 from the upper portion of the trench is removed with a dry isotropic etch. Preferably, the first layer of conductive material 60 fills approximately 85% of the deep trench 62.

A collar oxide 63 is formed by thermal oxidation of the exposed silicon, along the walls of the trench 62, and on the top surface of the first layer of conductive material 60. In an alternative embodiment, the collar oxide 63 can be formed by deposition of a CVD oxide layer followed by a reactive ion etch (RIE).

Figure 6A:
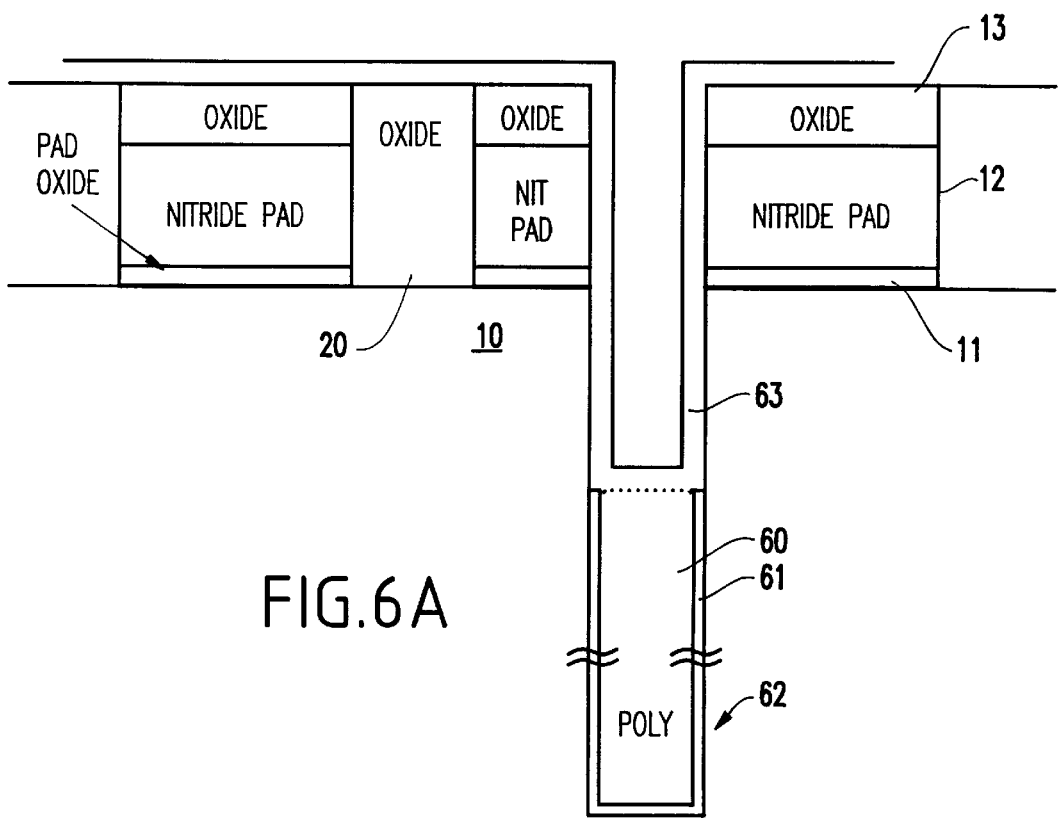
FIGS. 6A–6C are a cross-sectional views of a semiconductor device according to the invention.
Figure 6B:
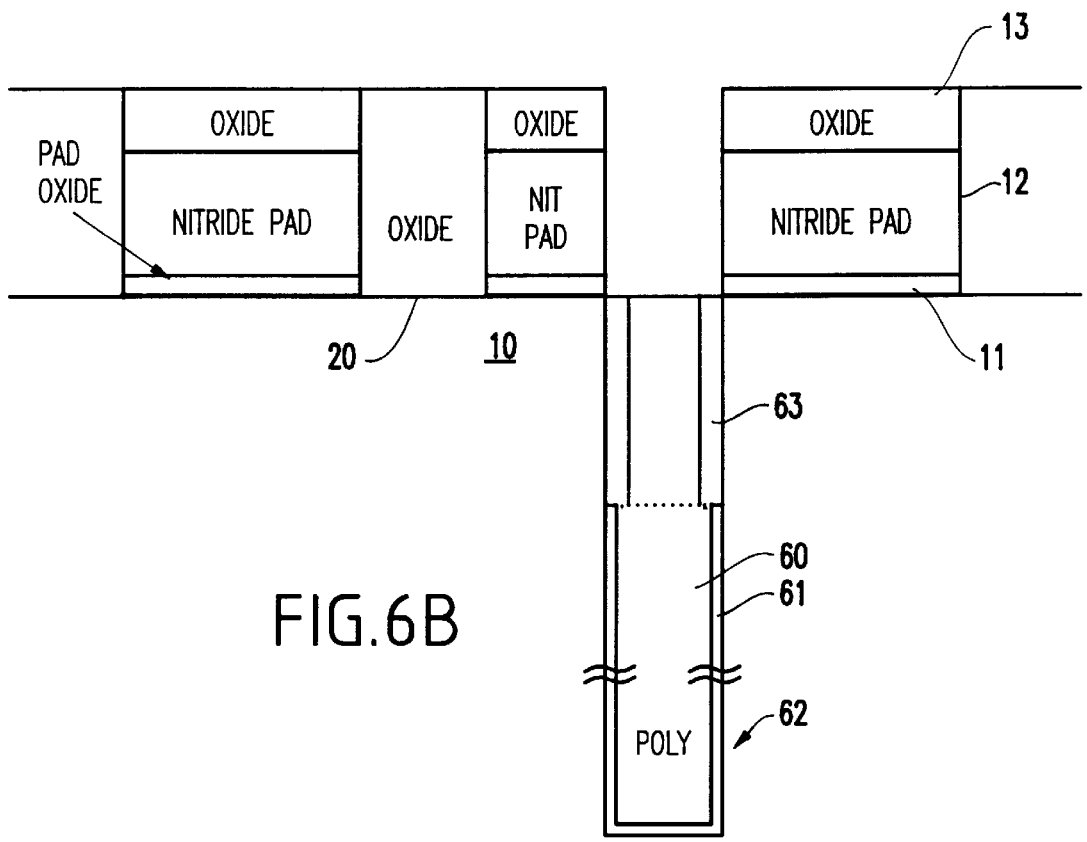

As shown in FIG. 6B, the collar oxide 63 is etched by, for example an anisotropic dry reactive ion etch (RIE). Such an RIE could use a mixture of gases which may include some portions of $C_3F_8$, $C_2F_6$, He, $CHF_3$, Ar, $O_2$, $C_4F_8$, and CO. The anisotropic dry etch, or sidewall spacer etch, removes material in a vertical direction at a high rate, but removes material in the horizontal direction at a relatively low rate. Thus, the collar oxide 63 remains only on the walls of the trench 62 as shown in FIG. 6B.

Figure 6C:
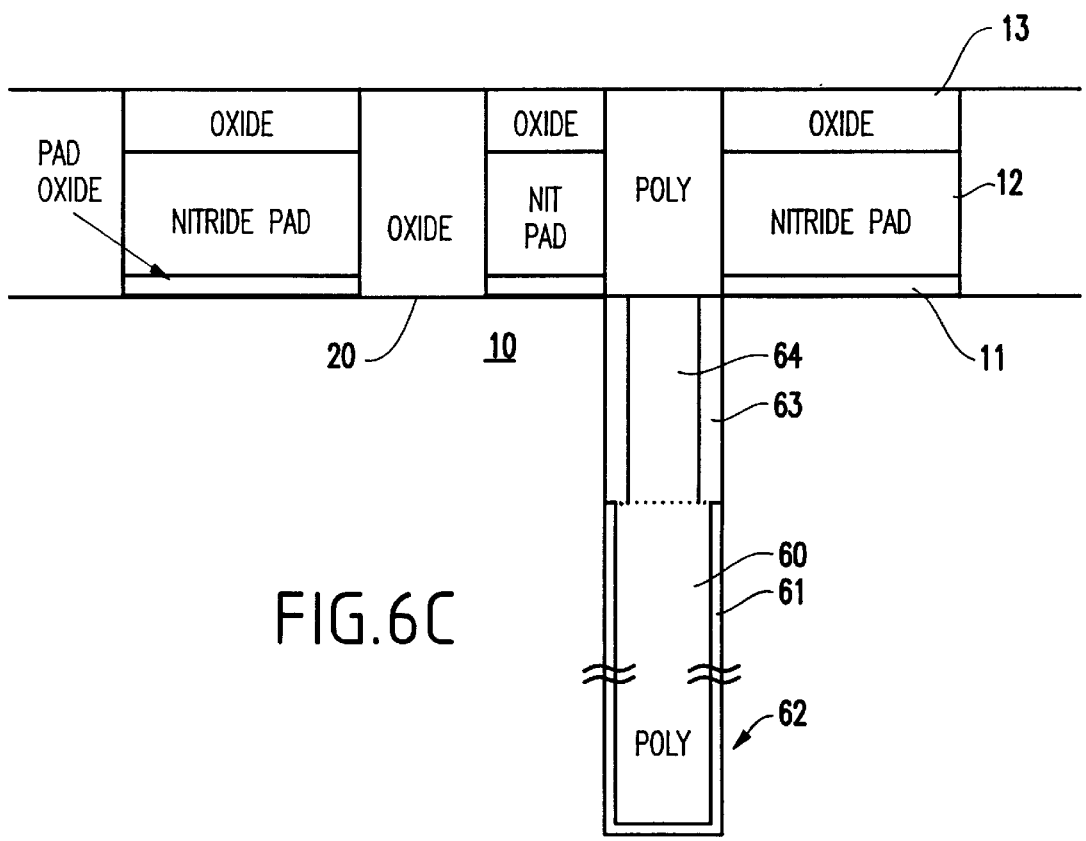

As shown in FIG. 6C, the remainder of the trench 60 is completely filled with a second level of conductive material 64 which is planarized to the top of the oxide layers 13, 20. Again, the second level of conductive material 64 could comprise polysilicon, or other similar conductive material. The first conductive material 60 may or may not be the same as the second level of conductive material 64.

Figure 7:
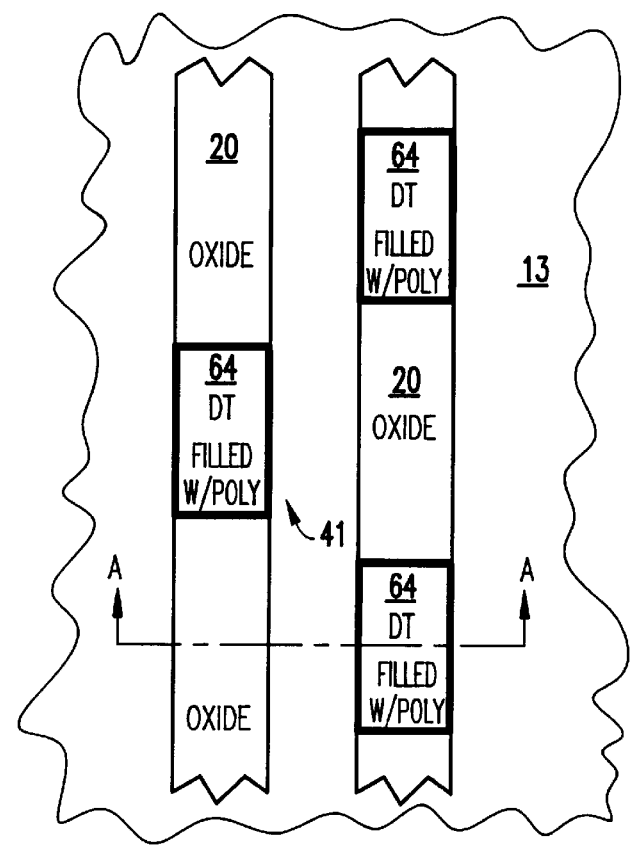
FIG. 7 is a top view of a semiconductor device according to the invention.

FIG. 7 shows a plan view of the deep trench 62 filled with polysilicon 64 (where the cross-sectional view illustrated in FIG. 6C appears in FIG. 7 along line A—A), the top of the oxide stripes 20 and the top of the oxide layers 13.

Figure 8:
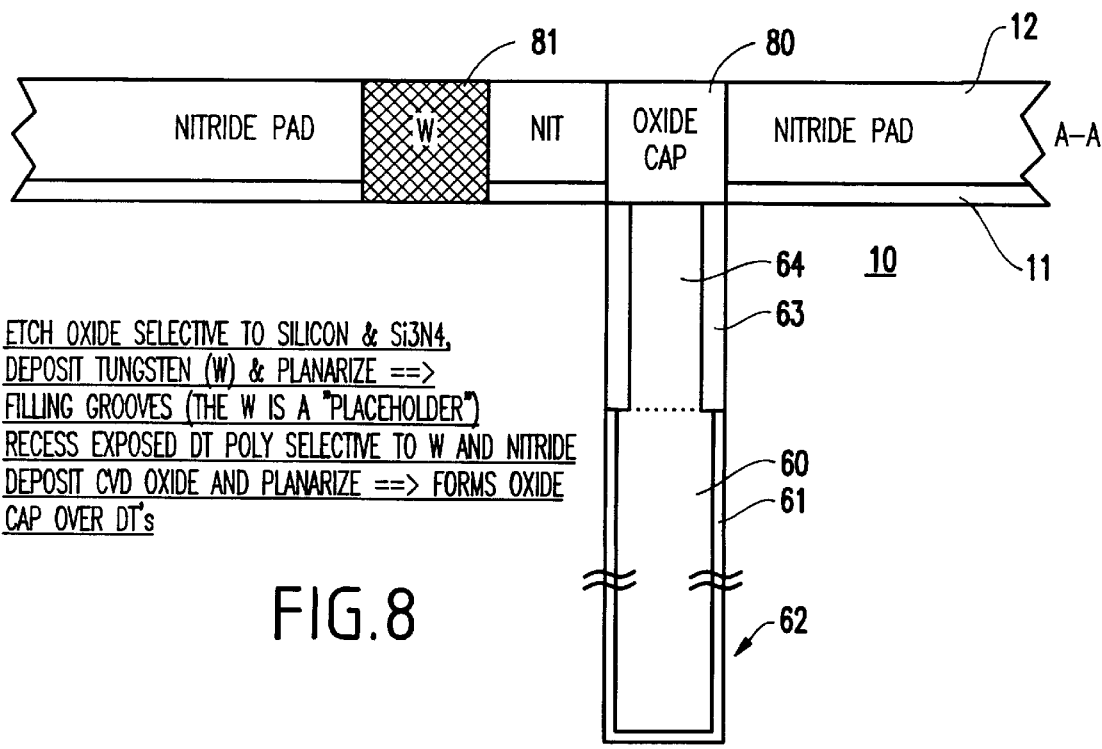
FIG. 8 is a cross-sectional view of a semiconductor device according to the invention.

As shown in FIG. 8, the oxide layers 13, 20 are removed using an etch which is selective to oxide and which does not etch silicon or silicon nitride. For example, such a selective etch could comprise a wet or dry fluorine based etch. The selective etch planarizes the top of the nitride pad 12 and removes the oxide stripes 20 leaving the stripes 15 empty again (as shown above in FIG. 1). Tungsten 81 is then deposited in the stripes 15 and planarized. The tungsten 81 serves as a "placeholder" for the later formed gate conductor material, as discussed in greater detail below.

The upper level of the polysilicon 64 is selectively etched down to at least the top of the collar oxide 63, using an etch which etches polysilicon at a substantially faster rate than it etches nitride or tungsten. For example, such an etch could include a dry HBr (Hydrogen Bromide) etch. As discussed above, other conductive materials may be used in place of the polysilicon 64 and, as would be known by one ordinarily skilled in the art given this disclosure, other selective etches may be used depending upon the conductive material deposited in the deep trench 62. Additionally, other "placeholder" materials can be used in place of the tungsten 81, such as Ge, Mo, which can be etched using, for example, a $H_2O_2$ (Hydrogen Peroxide) solution.

The remaining polysilicon material 64 is then covered with an oxide cap 80 using, for example, CVD of silicon dioxide deposition and planarization. The oxide 80 protects the deep trench 62 (e.g., storage trench) during the subsequent V-groove etch, as discussed below.

Next, the tungsten placeholders 81 are etched (again, selectively to the oxide cap 80 and the nitride layer 12) down to the silicon 10 surface using $H_2O_2$ (Hydrogen Peroxide) which can be a dry etch.

The exposed crystalline silicon surface is etched with a crystallographic preferential etch such as KOH or EDA (Ethylene Diamine Pyrocatechol). The crystallographic preferential etch etches silicon on the <100> surface much faster than on the <111> surface. This results in the formation of V-grooves.

The V-grooves 90 comprise rectangular based prismatic pits in the silicon 10. The walls of the V-grooves lie in the <111> crystal plane of the silicon 10. As discussed above, oxides grown on silicon are approximately 50%–70% thicker on surfaces aligned with the <111> crystal plane relative to the <100> crystal plane depending on oxidation conditions.

Immediately following the gate oxidation, it is preferable to perform a rapid thermal anneal (1000° C.–1100° C. for 15–30 seconds) to partially reflow the gate oxide in the V-groove. This reflow will thicken the oxide slightly at the bottom of the groove, improving reliability.

FIG. 10A illustrates an oxide (e.g., silicon dioxide, silicon oxynitride, etc.) layer 101 formed within the V-groove 90 which will serve as the gate dielectric of the array MOSFET. To the contrary, FIG. 10B illustrates an opening 102 for a support device (such as the support MOSFET devices, discussed above) which has a conventional planar surface which lies within the <100> plane of the silicon and which, when oxidized, forms a substantially thinner oxide layer 103.

Figure 11A:
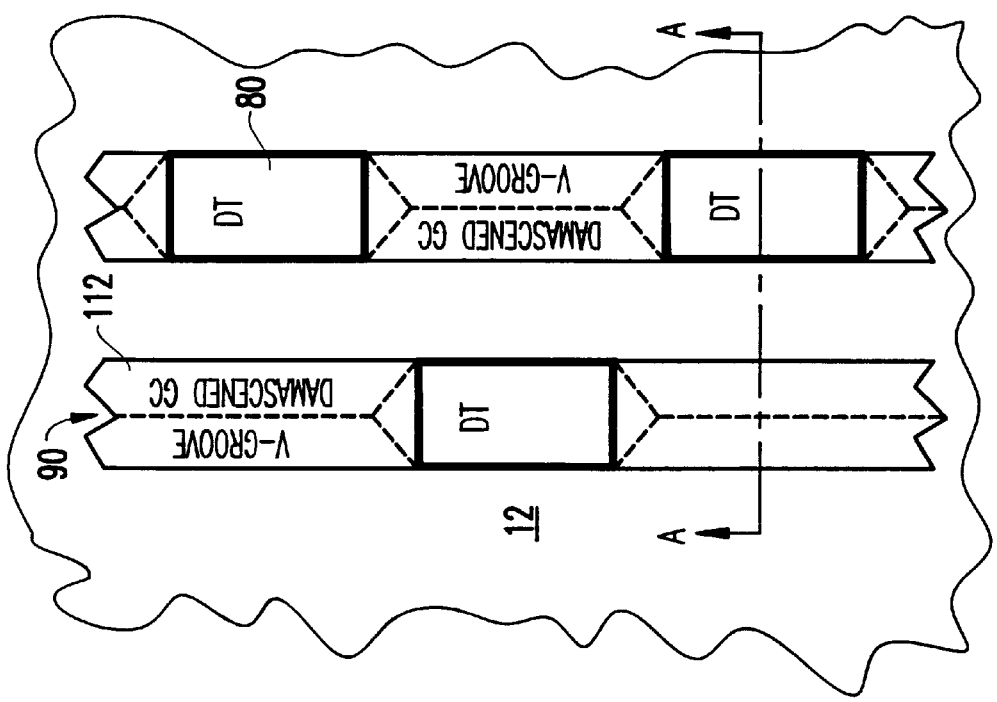
FIGS. 11A–11B are top views of a semiconductor device according to the invention.
Figure 11B:
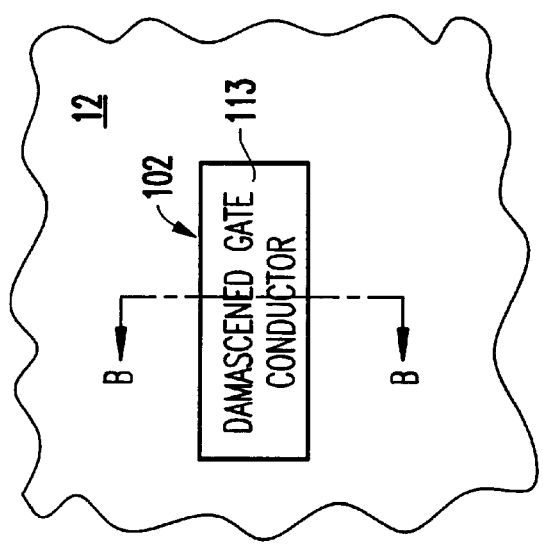

The gate conductor material 112, 113 (e.g., polysilicon, metal or other conductor) is then damascened over the oxide layers 101, 103 and planarized (again, using techniques well known to those ordinarily skilled in the art such as chemical mechanical polishing "CMP"), as illustrated in FIGS. 11A and 11B.

Figure 12A:
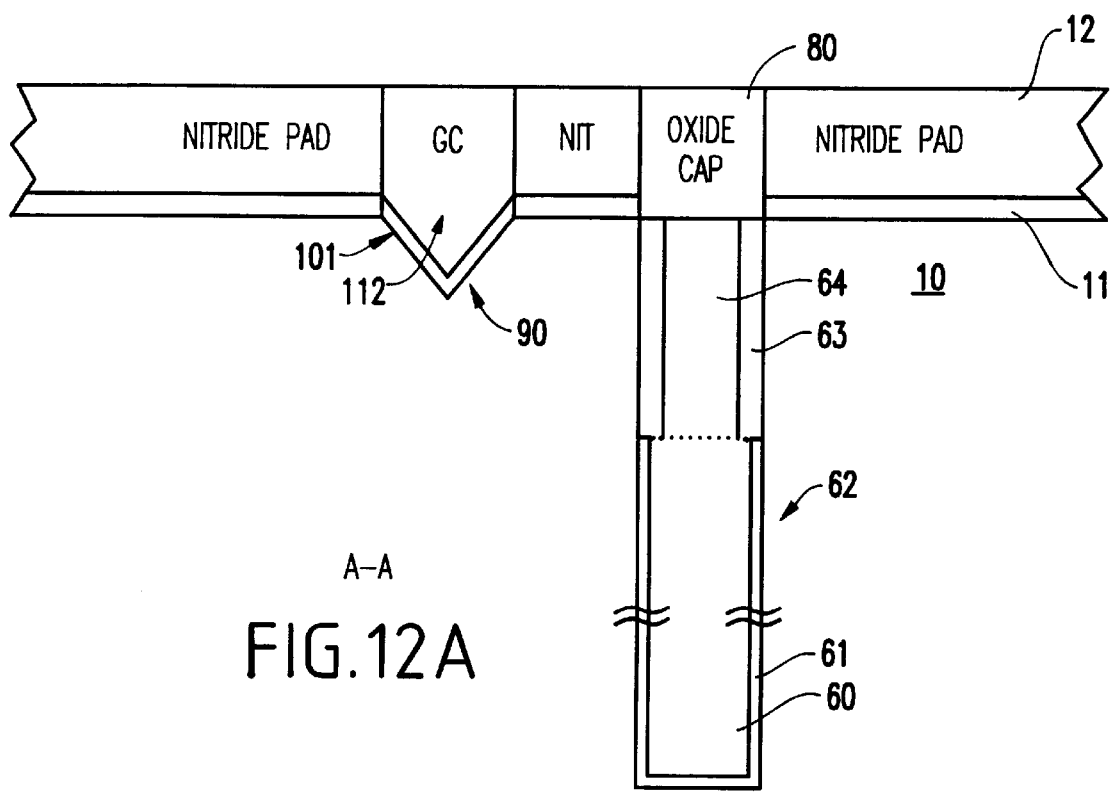
FIGS. 12A–12B are cross-sectional views of a semiconductor device according to the invention.
Figure 12B:
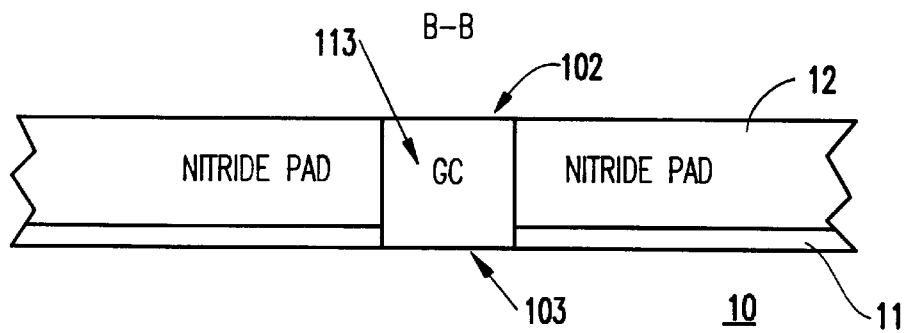

FIG. 12A is a cross-sectional view of the structure shown in FIG. 11A along line A—A. FIG. 12A illustrates the V-groove 90, the thick gate conductor oxide 101 and the gate conductor material 112, discussed above. Similarly, FIG. 12B is a cross-sectional view of the structure shown in FIG. 11B along line B—B. FIG. 12B shows the planar surface 102, the thin gate conductor oxide 103 and the gate conductor material 113, discussed above.

Figure 13A:
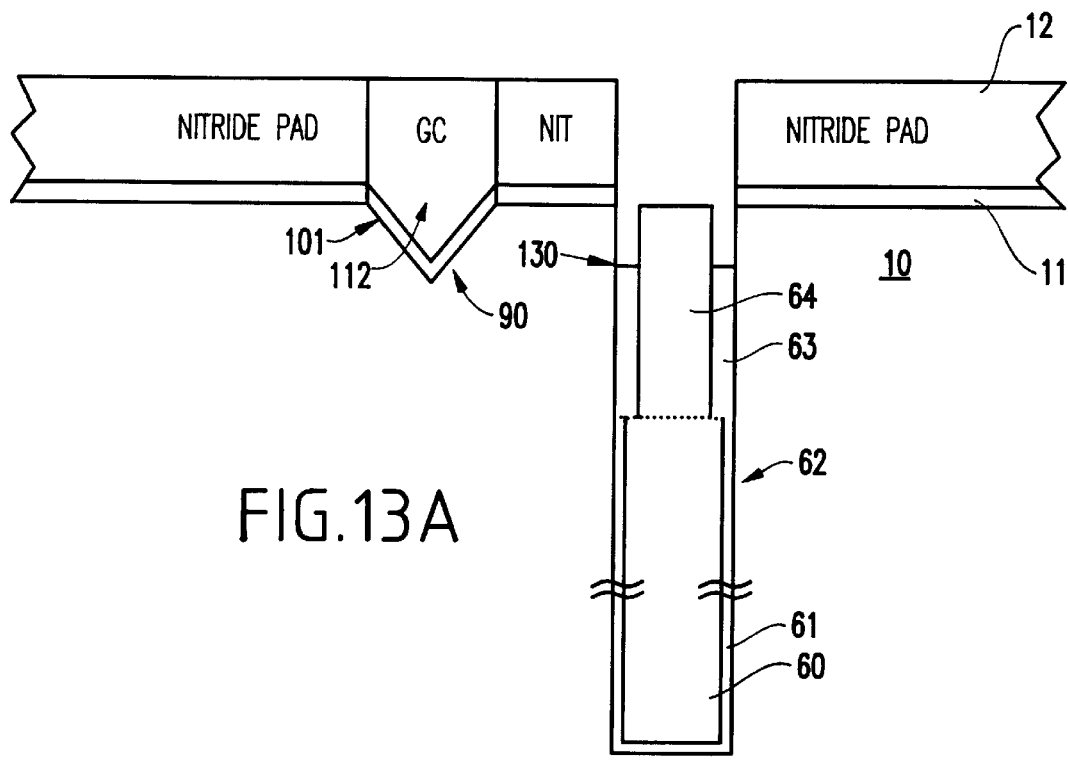
FIGS. 13A–13E are cross-sectional views of a semiconductor device according to the invention.
Figure 13B:
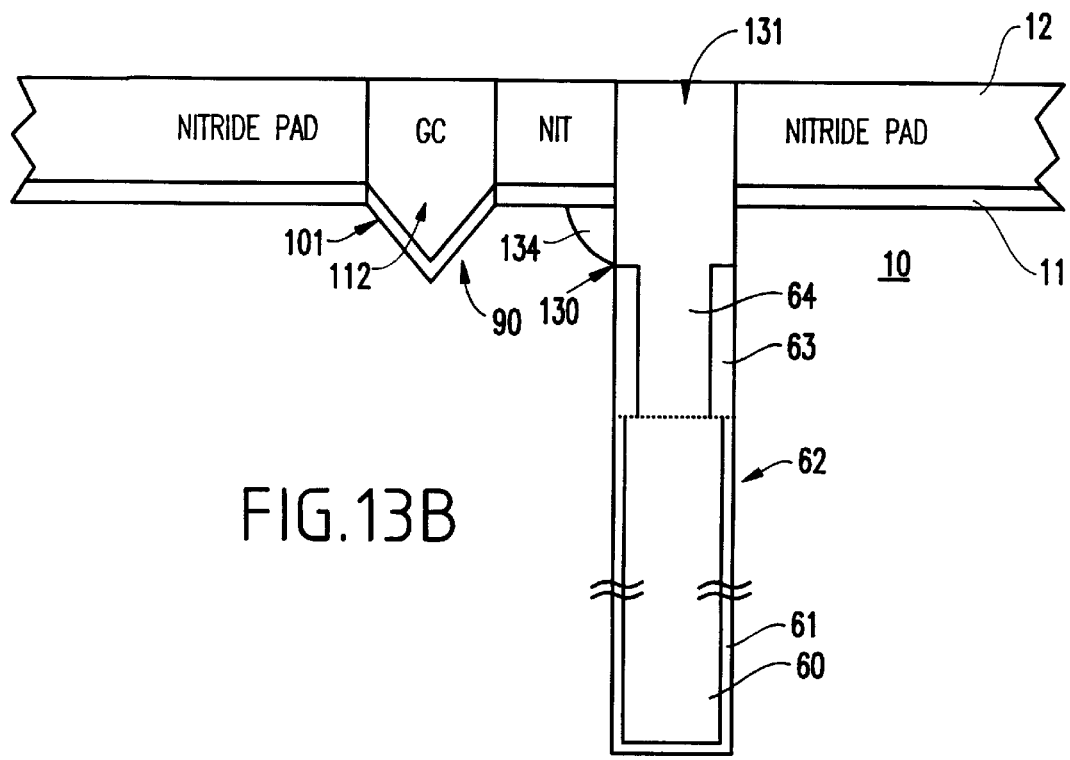

An etch which removes oxides at a much faster rate than it removes the gate conductor or nitride is applied to the structure and removes the oxide cap 80 and a portion of the oxide collar 63, as shown in FIG. 13A. For example, a suitable etch may include any one of the well known dry etches commonly practiced for oxide collar formation, such as $CHF_3+He+O_2$. The recess formed by the foregoing selective etch is filled with additional conductive material 131 (preferably polysilicon) which is added to the previous conductive material 64, as shown in FIG. 13B. This process also forms a conductive strap 134 using processes well-known to those ordinarily skilled in the art. The conductive material 131 can be the same material as conductive material 64 or can be a different material depending upon the specific application. The conductive materials 64, 131 will be referred to hereinafter simply as conductive material 64.

Figure 13C:
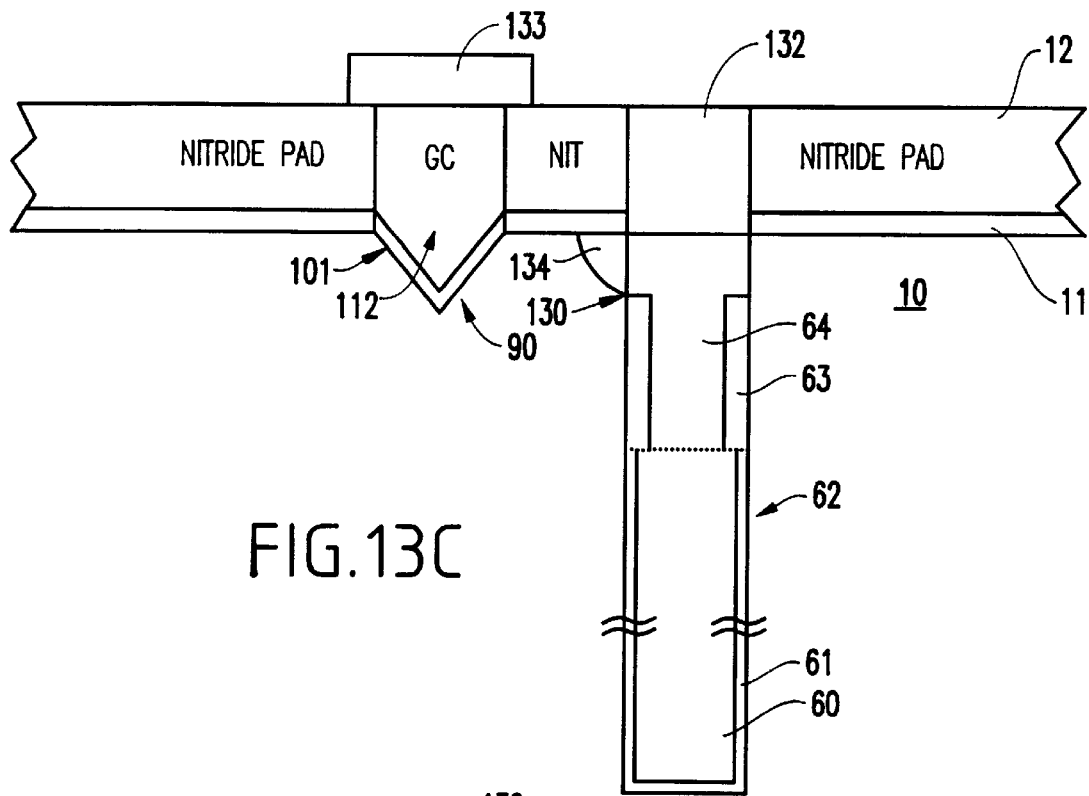

A protective mask 133 is formed over the gate conductor 112 using common techniques (such as lithographic masking techniques) and the conductive material in the trench 64 is etched to the top of the silicon 10, as shown in FIG. 13C. Subsequently, an oxide cap 132 is deposited and planarized (again using common techniques, discussed above), as shown in FIG. 13C.

Figure 13D:
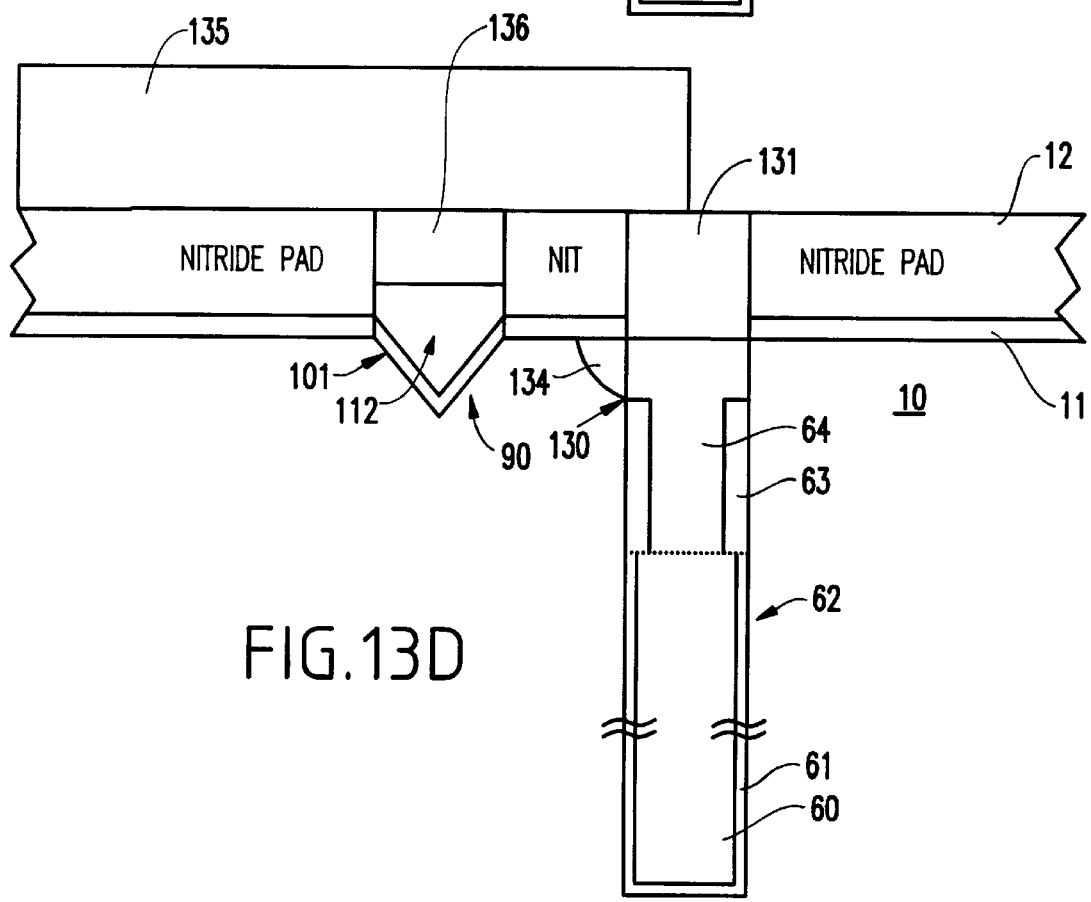

An etch which removes the gate conductor material at a much faster rate than it removes oxide or nitride materials is applied to selectively remove a portion of the gate conductor 112, as shown in FIG. 13D. For example, a suitable etch may include any one of the well known dry etches commonly practiced for oxide collar formation, such as $CHF_3+He+O_2$. An oxide cap 136 is formed in the opening formed by the foregoing selective etch and the oxide is planarized to the top of the nitride pad (again, using well known techniques, discussed above), as shown in FIG. 13D. Subsequently, an active area mask 135 is formed (again using common masking techniques, discussed above) to define the active areas of the array, as shown in FIG. 13D.

Figure 13E:
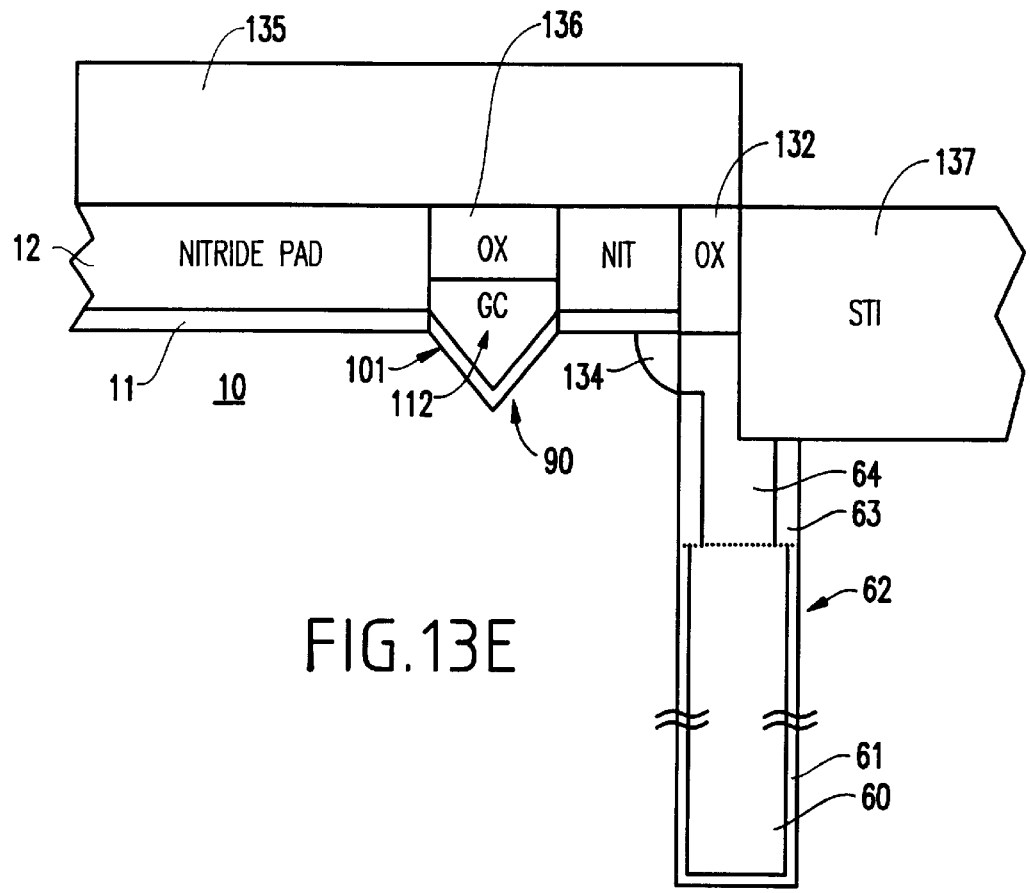

Common anisotropic etch processes, are used to form a shallow trench isolation (STI) recess. For example, first the portion of nitride pad 12 and oxide pad 11 not protected by the active area mask 135 and the exposed portion of the oxide cap 132 are removed down to the silicon 10 and polysilicon 64. Then a silicon etch is used to recess the silicon 10 and polysilicon 64 to the desired isolation depth. Anisotropic etches are used in conjunction with the active area mask 135 to remove portions of the nitride pad 12 and remove portions of the deep trench structure 62, as shown in FIG. 13E. The mask 135 is then removed. The recess formed by the active area mask etching is preferably filled with tetraethylorthosilicate (TEOS) or silane or HDP oxide to form shallow trench isolation region 137 over the active area of the array, as shown in FIG. 13E.

Figure 14:
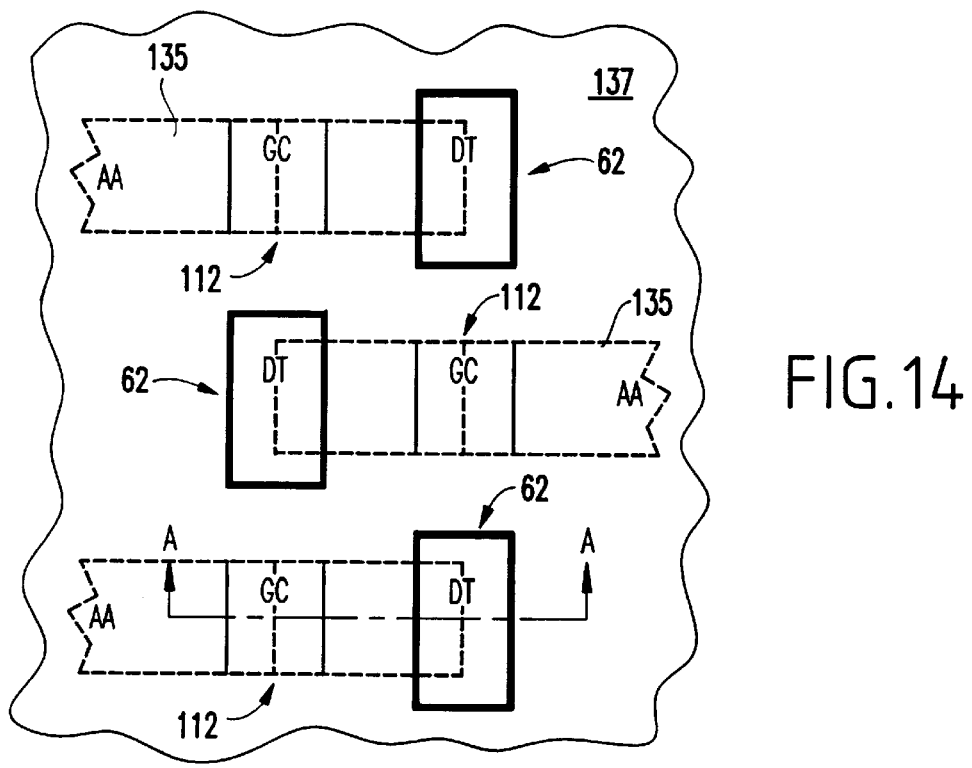
FIG. 14 is a top view of a semiconductor device according to the invention.

FIG. 14 illustrates a top view of the structure shown in FIG. 13E. The cross-sectional view shown in FIG. 13E appears along line A—A in FIG. 14. FIG. 14 illustrates the shallow trench isolation regions 137 as well as the deep trench area 62 and gate conductor the area 112.

Figure 15:
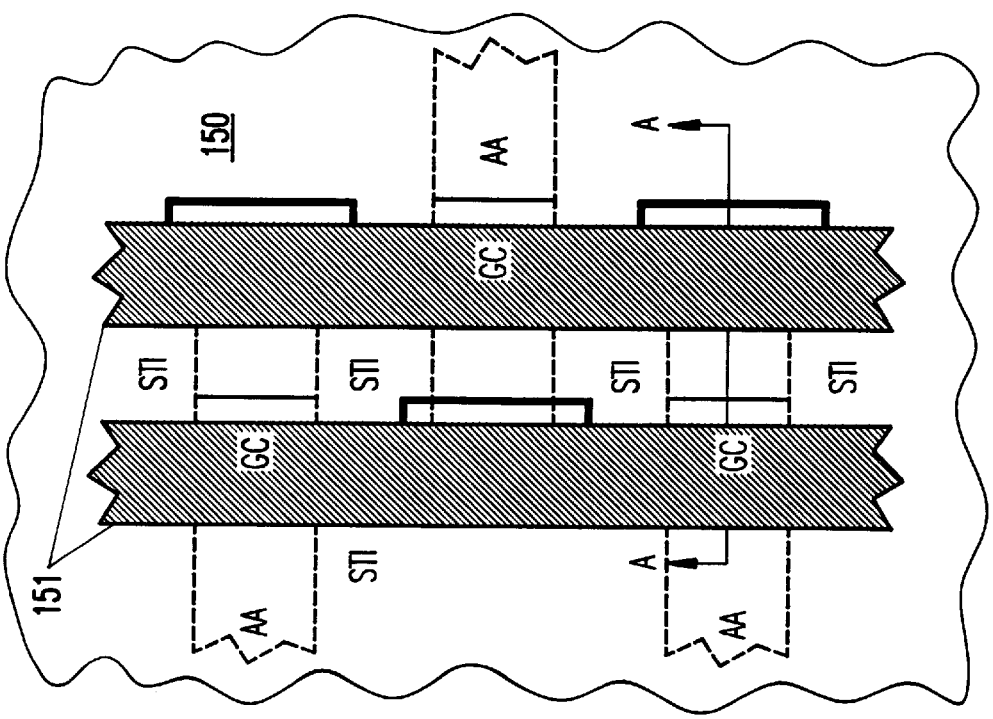
FIG. 15 is a top view of a semiconductor device according to the invention.

FIG. 15 illustrates a photoresist 150 covering the structure illustrated in FIG. 14. The photoresist includes openings 151 exposing portions of the planarized structure below, which includes nitride areas, an oxide capping the gate and deep trench, and the shallow trench isolation region 137.

The structure shown in FIG. 15 is subjected to a selective etch which etches oxide materials at a much faster rate than it etches nitride or polysilicon materials. This etch forms openings into which a conductive material (such as tungsten or any conductive material such as those discussed above) is deposited, planarized and recessed (e.g. damascened) to form wiring patterns such as word lines (WL) 160, 161, as shown in FIGS. 16 and 17.

Figure 16:
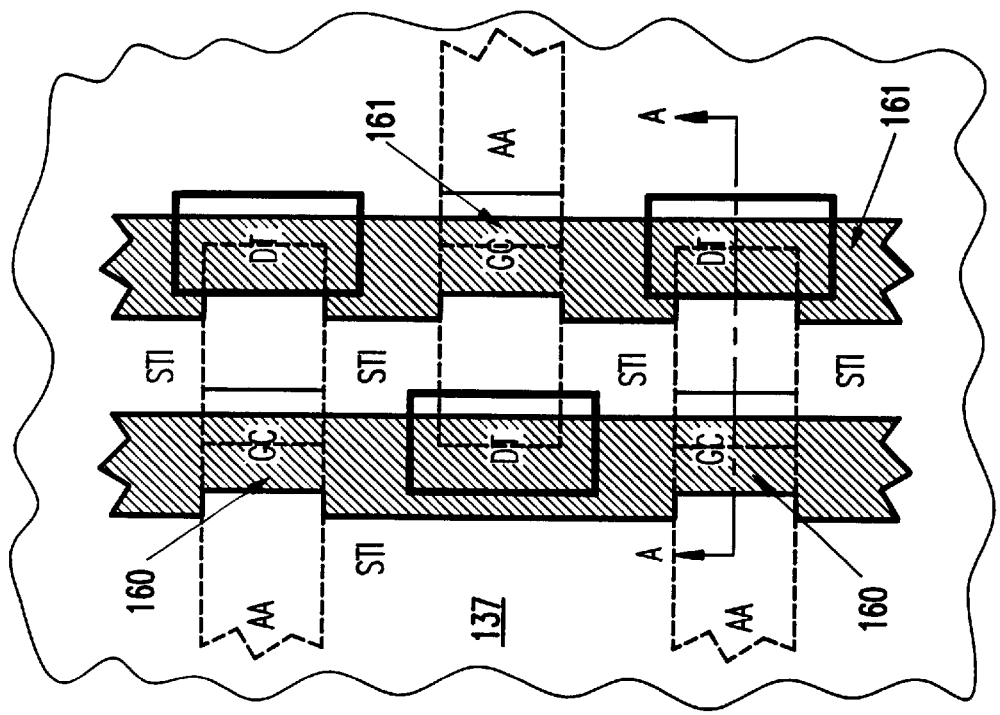
FIG. 16 is a top view of a semiconductor device according to the invention.
Figure 17:
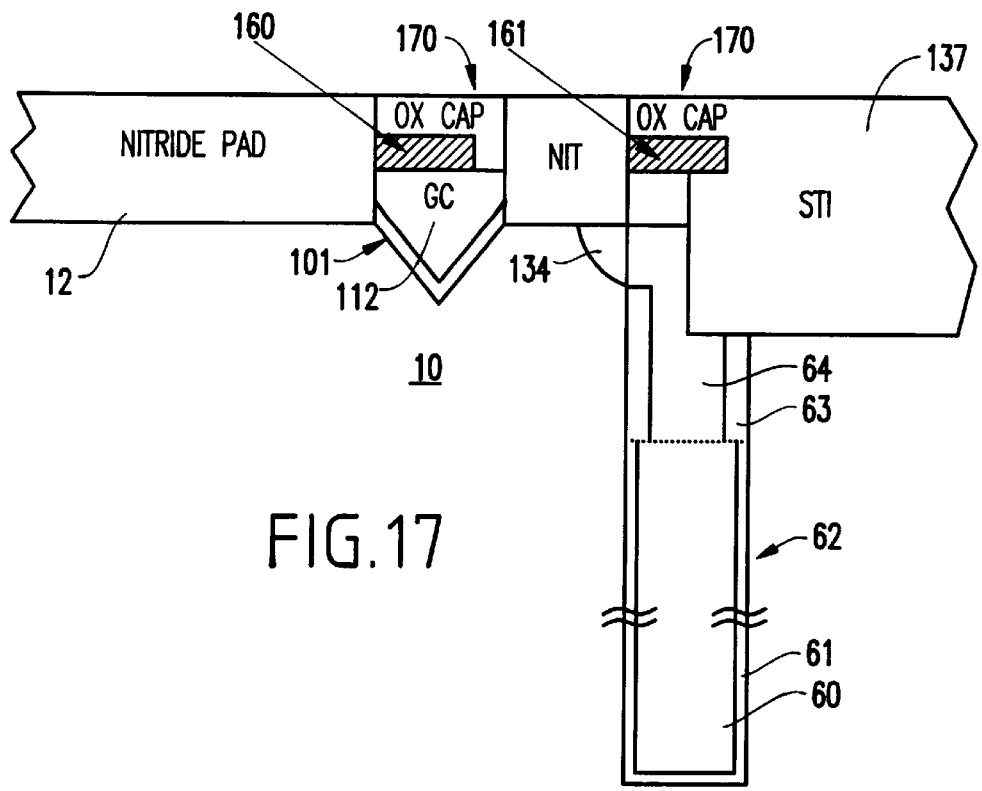
FIG. 17 is a cross-sectional view of a semiconductor device according to the invention.

More specifically, FIGS. 16 and 17 illustrate wordlines 160, 161 over the V-groove gate conductors 112 and over the deep trench structures 62. After the wordlines 160, 161 are formed, an oxide 170 (such as any of the oxides discussed above) is deposited in the cavity over the conductive layers and is planarized to the top of the nitride cap 12.

The openings 151 in the photoresist 150, shown in FIG. 15 are intentionally shown misaligned with the edges of the deep trench structures 62 and the gate conductors 112 to illustrate an advantage of the invention. As shown in FIG. 16, the misalignment of the openings 151 causes the wordlines 160, 161 to be misaligned. However, the presence of the nitride pad 12 causes the wordlines to be self-aligned with the gate conductor 112 and with the deep trench structure 62 as shown in FIG. 17. Therefore, the invention compensates for misalignment of the wordlines and allows for the subsequent formation of a bitline diffusion contact which may be self-registered to the edge of the gate conductor. The "borderless" bitline contacts results in a dense memory cell layout.

Figure 18:
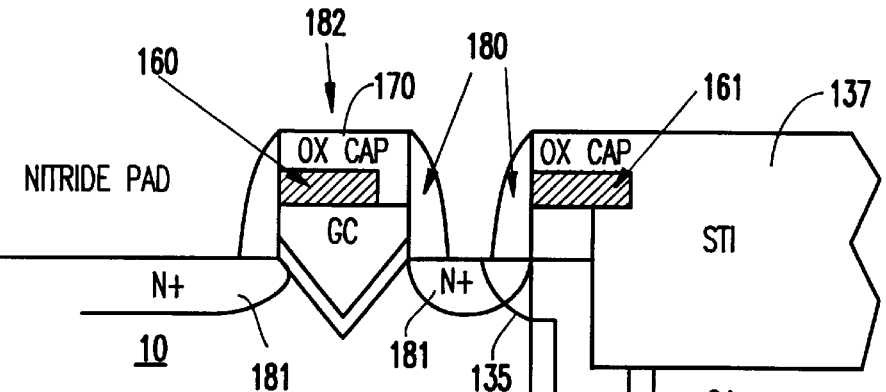
FIG. 18 is a cross-sectional view of a semiconductor device according to the invention.

As shown in FIG. 18, the nitride pad is removed by a selective etch process, such as hot phosphoric acid, exposing the silicon surface 10. Source and drain regions 181 are formed by implanting N-type dopants (such as phosphorus arsenic, etc.) for the array and support NFETs to complete the metal oxide semiconductor (MOS) device 182. A P+ source and drain dopant is implanted for the PFETs in the supports. The source and drain regions 181 are self-aligned by the oxide cap 170. An oxide 180 is deposited over the structure and is selectively removed from the horizontal surfaces (using, for example reactive ion etching) to form the sidewalls spacers 180.

Therefore, as discussed above, the invention utilizes V-groove metal oxide semiconductor (VMOS) devices 108 in a shallow trench isolation structure. The V-groove allows simultaneous formation of a thick oxide layer 101 (for the array) and a thin oxide layer 103 (for the support devices). Thus, the invention allows adequate boost voltage on the gate (wordline) of the array MOSFET, while maintaining gate oxide reliability, and good support device performance.

Further with the invention, the wordlines 160, 161 are borderless (e.g., self-aligned) to the VMOS gate conductor 112 and the deep trench structure 62 (because of the action of the nitride pad 12), even if the mask for the wordlines it is misaligned. Also, the stripes 15 of the invention allow adjacent VMOS devices 182 and deep trench structures 62 to be aligned with one another.

Additionally, the oxide shield 80, 63 (FIG. 8) protects the deep trench structure 62 while forming the V-groove 90 for the gate conductor 112, which reduces defects and increases yield when compared to conventional structures and processes.

While the invention has been described in terms of preferred embodiments, those skilled in the art will recognize that the invention can be practiced with modification within the spirit and scope of the appended claims.

What is claimed is:

1. A method of simultaneously forming array structures and support structures on a substrate, said method comprising:

forming a protective layer above said substrate;

forming stripes in said protective layer including patterning said protective layer to alternatively define locations for said array structures and locations for a plurality of storage structures along a length of said stripes, wherein said stripes align said array structures and said storage structures;

forming a V-groove in said location for said array structure; and forming said support structures outside said stripes to have a planar surface;

wherein said forming of said array structures and said forming of support structures includes simultaneously forming a first oxide in said V-groove and a second oxide on said planar surface, wherein said first oxide is thicker than said second oxide.

2. The method in claim 1, wherein said V-groove has at least one surface along a <111> crystal plane of said substrate and said planar surface is along a <100> crystal plane of said substrate.

3. The method in claim 1, wherein said forming of said V-groove comprises performing a crystallographic preferential etch which etches a <111> crystal plane of said substrate at a lower rate than a <100> crystal plane of said substrate.

4. The method in claim 1, further comprising forming a shallow trench isolation region for said array structures.

5. The method in claim 1, further comprising:

forming conductors in said locations for said array structures and said location for said storage structures; and forming wordlines above said conductors, wherein said patterned protective layer aligns said conductors and said wordlines.

6. The method in claim 5, wherein said forming of said wordlines comprises:

forming a third oxide above said conductors;

positioning a mask approximately over said locations for said array structures and said locations for said storage structure;

forming grooves in said third oxide for said wordlines using said mask; and depositing a conductive wordline material in said grooves, wherein said protective layer aligns at least one side of said wordlines and said conductors.

7. The method in claim 1, further comprising:

forming trenches for said storage structures in said substrate using said patterned protective layer as a mask;

forming storage conductors in said trenches;

forming a protective oxide layer over said storage conductors; and forming said V-groove of said array structures using said patterned protective layer as a mask.

8. A method of simultaneously forming array structures and storage structures on a substrate, said method comprising:

forming a protective layer above said substrate;

patterning said protective layer to form stripes that simultaneously define locations for said array structures and locations for said storage structures subsequently formed, wherein said locations for said array structures have a V-groove surface, and wherein said stripes align said array structures and said storage structures alternately along a length of said stripes;

forming conductors in said locations for said array structures and said locations for said storage structures; and forming wordlines above said conductors, wherein said patterned protective layer aligns said conductors and said wordlines along said stripes.

9. The method in claim 8, wherein said forming of said wordlines comprises:

forming an oxide above said conductors;

positioning a mask approximately over said locations for said array structures and said locations for said storage structures;

forming grooves in said oxide for said wordlines using said mask; and depositing a conductive wordline material in said grooves, wherein said protective layer aligns at least one side of said wordlines and said conductors.

10. The method in claim 8, further comprising:

forming said array structures to have a V-groove surface;

forming support structures to have a planar surface; and simultaneously forming a first oxide in said V-groove and a second oxide on said planar surface, wherein said first oxide is thicker than said second oxide.

11. The method in claim 10, wherein said V-groove has at least one surface along a <111> crystal plane of said substrate and said planar surface is along a <100> crystal plane of said substrate.

12. The method in claim 10, wherein said forming of said V-groove comprises performing a crystallographic preferential etch which etches a <111> crystal plane of said substrate at a different rate than a <100> crystal plane of said substrate.

13. The method in claim 10, further comprising forming a shallow trench isolation region for said array structures.

14. The method in claim 10, further comprising:

forming trenches for said storage structures in said substrate using said patterned protective layer as a mask;

forming storage conductors in said trenches;

forming a protective oxide layer over said storage conductors; and forming said V-groove of said array structures using said patterned protective layer as a mask.

15. A method of simultaneously forming array structures and storage structures on a substrate, said method comprising:

forming a protective layer above said substrate;

forming stripes in said protective layer to alternately define locations for said array structures and said storage structures subsequently formed along a length of said stripes, wherein said stripes align said array structures and said storage structures.

16. The method in claim 15, further comprising:

forming conductors in said locations for said array structures and said locations for said storage structures; and forming wordlines above said conductors, wherein said patterned protective layer aligns said conductors and said wordlines.

17. The method in claim 16, wherein said forming of said wordlines comprises:

forming an oxide above said conductors;

positioning a mask approximately over said locations for said array structures and said locations for said storage structures;

forming grooves in said oxide for said wordlines using said mask; and depositing a conductive wordline material in said grooves, wherein said protective layer aligns at least one side of said wordlines and said conductors.

18. The method in claim 15, further comprising:

forming said array structures to have a V-groove surface;

forming support structures to have a planar surface; and simultaneously forming a first oxide in said V-groove and a second oxide on said planar surface, wherein said first oxide is thicker than said second oxide.

19. The method in claim 18, wherein said V-groove has at least one surface along a <111> crystal plane of said substrate and said planar surface is along a <100> crystal plane of said substrate.

20. The method in claim 18, wherein said forming of said V-groove comprises performing a crystallographic preferential etch which etches a <111> crystal plane of said substrate at a lower rate than a <100> crystal plane of said substrate.

21. The method in claim 18, further comprising forming a shallow trench isolation region for said array structures.

22. The method in claim 18, further comprising:

forming trenches for said storage structures in said substrate using said patterned protective layer as a mask;

forming storage conductors in said trenches;

forming a protective oxide layer as a mask over said storage conductors; and forming said V-groove using said patterned protective layer.

23. The method in claim 1, wherein said storage structures comprise trench storage structures.

24. The method in claim 8, wherein said storage structures comprise trench storage structures.

25. The method in claim 15, wherein said storage structures comprise trench storage structures.

* * * * *